(12) United States Patent
Moriwaki

(10) Patent No.: US 9,972,648 B2
(45) Date of Patent: May 15, 2018

(54) ELECTRO-OPTICAL DEVICE AND ELECTRONIC APPARATUS

(71) Applicant: SEIKO EPSON CORPORATION, Tokyo (JP)

(72) Inventor: Minoru Moriwaki, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 47 days.

(21) Appl. No.: 15/098,687

(22) Filed: Apr. 14, 2016

(65) Prior Publication Data
US 2016/0351600 A1 Dec. 1, 2016

(30) Foreign Application Priority Data
May 26, 2015 (JP) ................ 2015-106170

(51) Int. Cl.
*H01L 27/12* (2006.01)
*H01L 29/786* (2006.01)
*G02F 1/1362* (2006.01)
*G02F 1/1368* (2006.01)
*H04N 9/31* (2006.01)

(52) U.S. Cl.
CPC ........ *H01L 27/1255* (2013.01); *G02F 1/1368* (2013.01); *G02F 1/136213* (2013.01); *G02F 1/136286* (2013.01); *H01L 27/124* (2013.01); *H01L 27/1222* (2013.01); *H01L 29/78621* (2013.01); *H01L 29/78675* (2013.01); *H04N 9/312* (2013.01)

(58) Field of Classification Search
CPC ............. H01L 27/1255; H01L 27/1222; H01L 27/124; H01L 29/78621; H01L 29/78675; G02F 1/136213; G02F 1/1368; G02F 1/136286; G02F 1/136204; G02F 1/136227; H04N 9/312
USPC ......... 349/42; 345/211, 87; 257/71, E29.273
See application file for complete search history.

(56) References Cited

U.S. PATENT DOCUMENTS

2011/0222008 A1 9/2011 Moriwaki et al.
2011/0242470 A1 10/2011 Moriwaki
(Continued)

FOREIGN PATENT DOCUMENTS

JP 2011-075773 A 4/2011
JP 2011-186293 A 9/2011
(Continued)

*Primary Examiner* — David Vu
*Assistant Examiner* — Mouloucoulaye Inoussa
(74) *Attorney, Agent, or Firm* — Oliff PLC

(57) ABSTRACT

An electro-optical device includes a substrate, a transistor over the substrate, a pixel electrode over the transistor, a source line between the transistor and the pixel electrode, a fixed potential line over the substrate, a first capacitive element comprising a first electrode electrically connected to the fixed potential line, a first capacitance film, and a second electrode, a second capacitive element comprising the second electrode, a second capacitance film, and a third electrode electrically connected to the fixed potential line, a third capacitive element comprising the fixed potential line, a third capacitance film, and a fourth electrode. The first capacitive element and the second capacitive element are provided between the transistor and the source line, and the third capacitive element is provided between the source line and the pixel electrode.

2 Claims, 12 Drawing Sheets

(56) References Cited

U.S. PATENT DOCUMENTS

2013/0044284 A1 2/2013 Moriwaki
2015/0293418 A1* 10/2015 Moriwaki ......... G02F 1/136209
349/43

FOREIGN PATENT DOCUMENTS

| JP | 2011-221071 A | 11/2011 |
| JP | 2013-041131 A | 2/2013 |
| JP | 2015-197584 A | 11/2015 |
| WO | 2015/151517 A1 | 10/2015 |

* cited by examiner

ELECTRO-OPTICAL DEVICE AND ELECTRONIC APPARATUS

BACKGROUND

1. Technical Field

The present invention relates to an electro-optical device and an electronic apparatus.

2. Related Art

As an electro-optical device, for example, a liquid crystal device of an active driving type, which includes transistors for switch-controlling pixel electrodes provided in every pixel, is known. The liquid crystal device is used as, for example, a liquid crystal light valve of a liquid crystal projector as an electronic apparatus.

In the liquid crystal device described above, in order to maintain a pixel potential, a maintaining capacitor (capacitive element) having a structure in which a dielectric film is interposed between a pair of capacitance electrodes, is included. For example, in JP-A-2013-41131, a structure in which two capacitive elements are connected in parallel in a vertical direction, in order to increase the maintaining capacitor which does not cause deterioration of an aperture ratio, is disclosed.

However, in a case in which improvement of high resolution and high definition of pixels is progressed, a capacitance value of the capacitive element becomes insufficient, and thus there is a problem in that data is not easily maintained. As a result, there is a problem in that display quality is deteriorated. In addition, in the case of a high-speed driving, there is a problem in that an unnecessary parasitic capacitance increases a voltage fluctuation in a source line or a gate line, and deterioration of display quality, such as flickering of a display image, is caused.

SUMMARY

The invention can be realized in the following aspects or application examples.

Application Example 1

According to this application example, there is provided an electro-optical device including a substrate, a transistor over the substrate, a pixel electrode over the transistor, a source line between the transistor and the pixel electrode, a fixed potential line over the substrate, the fixed potential line is supplied a fixed potential, a first capacitive element comprising a first electrode electrically connected to the fixed potential line, a first capacitance film, and a second electrode, a second capacitive element comprising the second electrode, a second capacitance film, and a third electrode electrically connected to the fixed potential line, a third capacitive element comprising the fixed potential line, a third capacitance film, and a fourth electrode. The first capacitive element and the second capacitive element are positioned between the transistor and the source line, and the third capacitive element is positioned between the source line and the pixel electrode.

a substrate, a transistor that is provided on the substrate, a pixel electrode that is provided on the transistor, a source line that is provided between the transistor and the pixel electrode, and a fixed potential line that is electrically connected to a fixed potential, which is provided on the substrate, in which a first capacitive element, which is configured to have a first electrode electrically connected to the fixed potential line, a first capacitance film, and a second electrode, and a second capacitive element, which is configured to have the second electrode, a second capacitance film, and a third electrode electrically connected to the fixed potential line, are provided between the transistor and the source line from the substrate side, and a third capacitive element, which is configured to have the fixed potential line, a third capacitance film, and a fourth electrode, is provided between the source line and the pixel electrode from the substrate side.

According to the application example, in addition to the first capacitive element and the second capacitive element provided at the transistor side with respect to the source line, the third capacitive element provided at the pixel electrode side with respect to the source line is included, and thus a maintaining capacitor for maintaining the pixel potential can be increased. Accordingly, deterioration of display quality due to insufficient maintaining capacitor can be suppressed. In addition, it becomes possible to deal with high speed driving in high resolution (for example, "4K2K", or the like), and high display quality can be obtained. Further, the fixed potential line is disposed between the source line (or gate line) and each capacitive element, and thus a voltage for writing on the pixel electrode does not easily receive the influence of voltage fluctuation of the source line. Therefore, display quality can be improved.

Application Example 2

According to this application example, there is provided an electro-optical device including a substrate, a transistor that is provided on the substrate, a pixel electrode that is provided on the transistor, a source line that is provided between the transistor and the pixel electrode, and a fixed potential line that is electrically connected to a fixed potential, which is provided on the substrate, in which a first capacitive element, which is configured to have a first electrode electrically connected to the fixed potential line, a first capacitance film, and a second electrode, and a second capacitive element, which is configured to have the second electrode, a second capacitance film, and a third electrode electrically connected to the fixed potential line, are provided between the transistor and the source line from the substrate side, and a third capacitive element, which is configured to have the fixed potential line, a third capacitance film, and the pixel electrode, is provided between the source line and the pixel electrode from the substrate side.

According to the application example, in addition to the first capacitive element and the second capacitive element provided at the transistor side with respect to the source line, the third capacitive element provided at the pixel electrode side with respect to the source line is included, and thus a maintaining capacitor for maintaining the pixel potential can be increased. Accordingly, deterioration of display quality due to insufficient maintaining capacitor can be suppressed. In addition, it becomes possible to deal with high speed driving in high resolution (for example, "4K2K", or the like), and high display quality can be obtained. Further, the fixed potential line is disposed between the source line (or gate line) and each capacitive element, and thus a voltage for writing on the pixel electrode does not easily receive an influence of voltage fluctuation of the source line. Therefore, display quality can be improved.

Application Example 3

According to this application example, there is provided an electro-optical device including a substrate, a transistor that is provided on the substrate, a pixel electrode that is provided on the transistor, a source line that is provided between the transistor and the pixel electrode, and a fixed potential line that is electrically connected to a fixed potential, which is provided on the substrate, in which a first capacitive element, which is configured to have a first electrode electrically connected to the fixed potential line, a first capacitance film, and a second electrode, and a second capacitive element, which is configured to have the second electrode, a second capacitance film, and a third electrode electrically connected to the fixed potential line, are provided between the transistor and the source line from the substrate side, and a third capacitive element, which is configured to have a fixed potential branch line that is electrically connected to the fixed potential line and is formed in a different layer from the fixed potential line through an insulation film, a third capacitance film, and the pixel electrode, is provided between the source line and the pixel electrode from the substrate side.

According to the application example, in addition to the first capacitive element and the second capacitive element provided at the transistor side with respect to the source line, the third capacitive element provided at the pixel electrode side with respect to the source line is included, and thus a maintaining capacitor for maintaining the pixel potential can be increased. Accordingly, deterioration of display quality due to insufficient maintaining capacitor can be suppressed. In addition, it becomes possible to deal with high speed driving in high resolution (for example, "4K2K", or the like), and high display quality can be obtained. Further, the fixed potential line is disposed between the source line (or gate line) and each capacitive element, and thus a voltage for writing on the pixel electrode does not easily receive an influence of voltage fluctuation of the source line. Therefore, display quality can be improved.

Application Example 4

In the electro-optical device according to the application example, it is preferable that the fixed potential line is formed along an extending direction of the source line, and the fixed potential branch line is formed in a direction intersecting the fixed potential line.

According to the application example, the fixed potential line and the fixed potential branch line electrically connected to the fixed potential are disposed to intersect each other through an insulation film, in other words, a wiring area, in which the fixed potential line (fixed potential branch line) is formed in a matrix shape, is increased, and thus resistance of the fixed potential line can be reduced. In addition, it is possible to decrease the resistance without significantly decreasing the opening area because the fixed potential line and the fixed potential branch line are formed in different layers, for example, a wiring width is not widened. Further, according to the fixed potential line (fixed potential branch line), shielding region with respect to the source line (or gate line) can be increased, and thus an influence of a voltage of the source line can be suppressed. Therefore, display quality can be improved.

Application Example 5

In the electro-optical device according to the application example, it is preferable that the pixel electrode is a transparent conductive material.

According to the application example, since the capacitive element is made of the transparent conductive material, for example, a metal material different from the pixel electrode may not be pattern-formed, and it is possible to efficiently form the capacitive element using the smaller number of manufacturing processes.

Application Example 6

According to this application example, there is provided an electronic apparatus including the electro-optical device according to the application examples.

According to the application example, the electronic apparatus, which is capable of realizing high resolution display, can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a specified embodiment of the invention will be described with reference to drawings. Also, the drawings being used are illustrated to be appropriately enlarged or reduced in size so that part to be described is capable of being recognized.

In addition, in the embodiment described below, for example, when "on a substrate" is disclosed, it indicates a case of being connected on the substrate, a case of being disposed on the substrate through the other components, or a case in which a part is disposed to be connected on the substrate and a part is disposed through the other components.

In the embodiment, an active matrix type liquid crystal device, which includes a thin film transistor (TFT) as a switching element of pixels, will be described as an example. The liquid crystal device can be appropriately used as, for example, an optical modulation element (liquid crystal light valve) of an electronic apparatus (liquid crystal projector) to be described later.

First Embodiment

Configuration of Liquid Crystal Device as Electro-Optical Device

Figure 1:
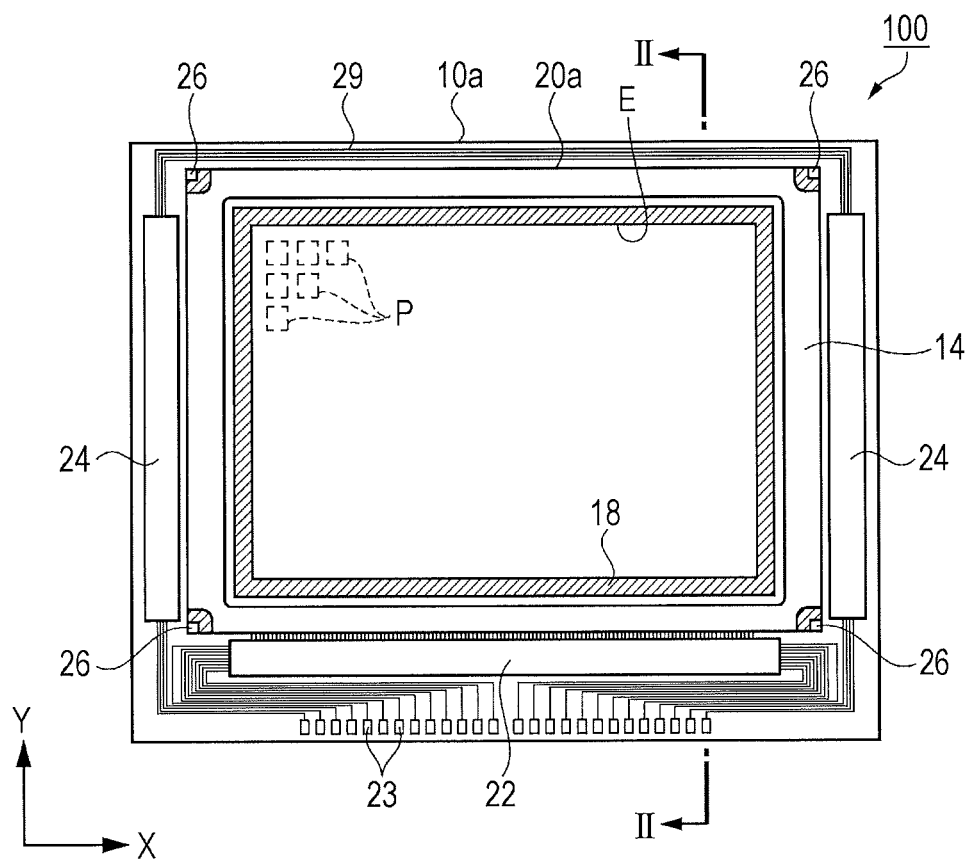
FIG. 1 is a perspective plan view illustrating a structure of a liquid crystal device as an electro-optical device of a first embodiment.
Figure 2:
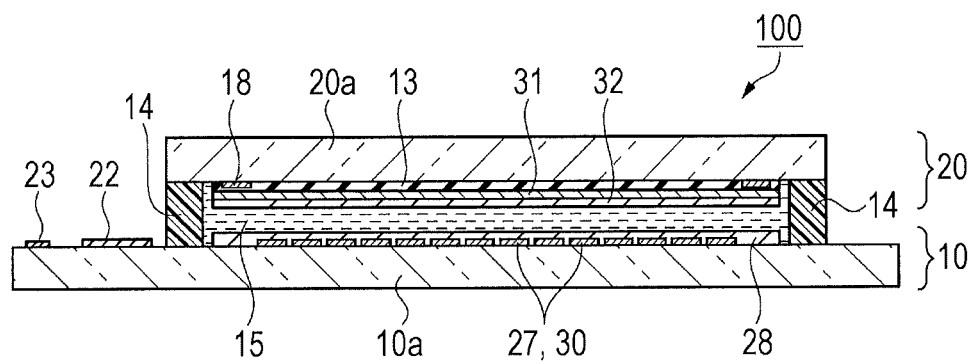
FIG. 2 is a perspective sectional view taken along line II-II of the liquid crystal device illustrated in FIG. 1.
Figure 3:
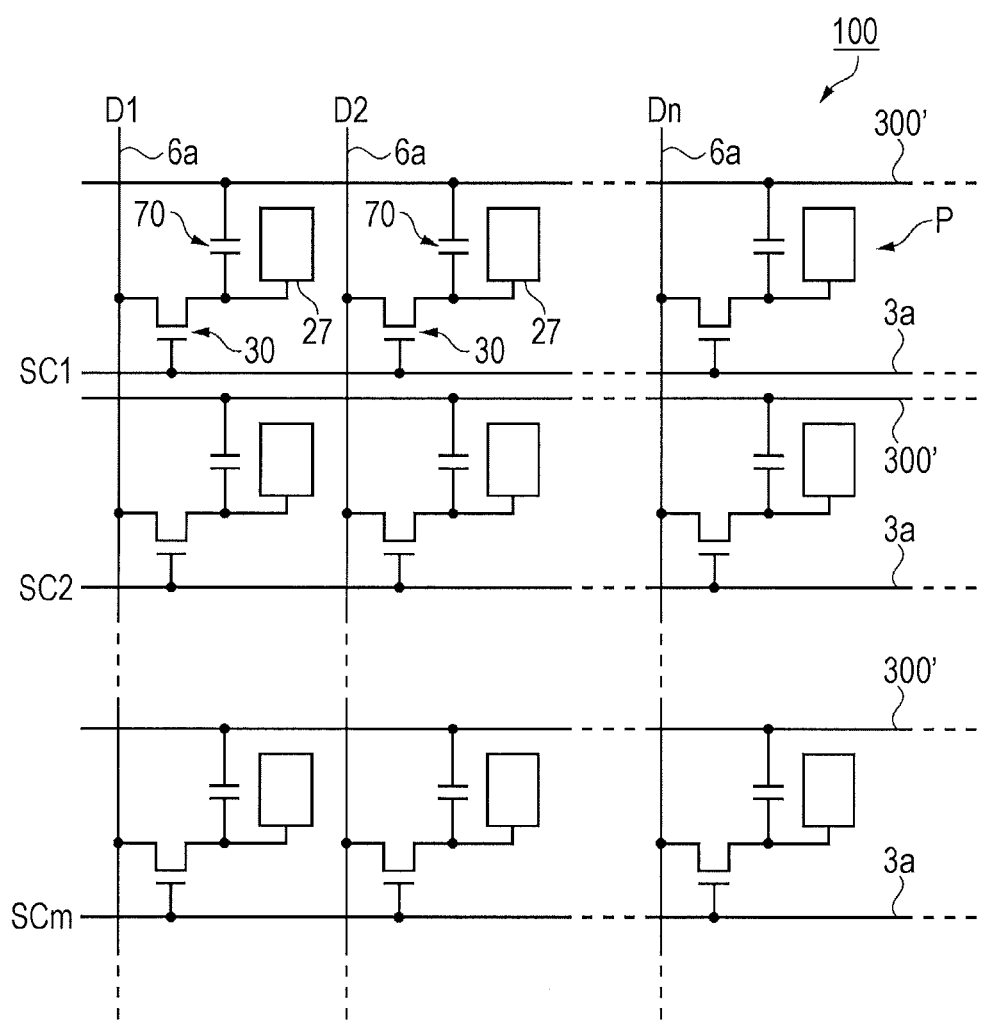
FIG. 3 is an equivalent circuit diagram illustrating an electric configuration of the liquid crystal device.

FIG. 1 is a perspective plan view illustrating a structure of a liquid crystal device as the electro-optical device. FIG. 2 is a perspective sectional view taken along line II-II of the liquid crystal device illustrated in FIG. 1. FIG. 3 is an equivalent circuit diagram illustrating an electric configuration of the liquid crystal device. Hereinafter, a configuration of the liquid crystal device will be described with reference to FIG. 1 to FIG. 3.

As illustrated in FIG. 1 and FIG. 2, a liquid crystal device 100 of the embodiment includes an element substrate 10 and an opposite substrate 20 which are opposite each other, and a liquid crystal layer 15 pinched between a pair of the substrates described above. As a first base material 10a, which is used as a substrate constituting the element substrate 10, and a second base material 20a constituting the opposite substrate 20, for example, a transparent substrate, such as a glass substrate and a quartz substrate, is used.

The element substrate 10 is greater than the opposite substrate 20. Both substrates are bonded to each other through a sealing material 14 which is disposed along a circumference of the opposite substrate 20, and a negative dielectric anisotropic liquid crystal is enclosed in a gap therebetween so as to constitute the liquid crystal layer 15. As the sealing material 14, for example, an adhesive such as a thermosetting or ultraviolet-curable epoxy resin is adopted. In the sealing material 14, a gap material for uniformly maintaining the gap of the pair of substrates is mixed.

In the inside of the sealing material 14, a display region E in which a plurality of pixels P are arranged is included. The light shielding layer 18 (parting portion), which is made of, such as a light shielding metal or metal oxide, is disposed between the sealing material 14 and the display region E so as to surround the display region E. Also, the display region E may include a plurality of dummy pixels which is disposed so as to surround the plurality of pixels P contributing a display.

A data line driving circuit 22 is provided between one edge part of the first base material 10a and the sealing material 14 along the one edge part. In addition, an inspection circuit (not illustrated) in the inside of the sealing material 14 is provided along the other edge part opposite to the one edge part. Further, in two edge parts facing each other and intersecting the one edge part, two scanning line driving circuits 24 are respectively provided. In the other edge part facing the one edge part, a plurality of wirings 29 hooking up with the two scanning line driving circuits 24 are provided.

The wirings hooking up with the data line driving circuit 22 and the scanning line driving circuit 24 are connected to a plurality of external connection terminals 23 arranged along the one edge part. After that, a direction along the one edge part is set to an X direction, and a direction along the other two edge parts facing each other and intersecting the one edge part is set to a Y direction.

As illustrated in FIG. 2, in a surface of the liquid crystal layer 15 side of the first base material 10a, the pixel electrode 27 having light transmission properties provided in every pixel P, a thin film transistor 30 (hereinafter, refer to as "TFT 30") as the switching element, a signal wiring, and a first orientation film 28 covering these components are provided.

The pixel electrode 27 can be made of a transparent conductive material such as an indium tin oxide (ITO). In addition, a shielding structure for preventing from an incidence of light into a semiconductor layer in a TFT 30 and being instable of a switching operation. Such an element substrate 10 includes at least the TFT 30, the pixel electrode 27, and the first orientation film 28.

In a surface of the liquid crystal layer 15 side of the second base material 20a, the light shielding layer 18, an insulating layer 13 which is provided to cover the light shielding layer, a common electrode 31 which is provided to cover the insulating layer 13, and a second orientation film 32 covering the common electrode 31 are provided.

The common electrode 31 is made of, for example, a transparent conductive film, such as ITO, and covers the insulating layer, and the like, and further, electrically connects wiring of the element substrate 10 side nearer than a vertical conduction portion 26 provided at four corners of the opposite substrate 20 as illustrated in FIG. 1.

The first orientation film 28 covering the pixel electrode 27 and the second orientation film 32 covering the common electrode 31 are inorganic oriented films, and are selected based on the optical design of the liquid crystal device 100. For example, there is a film is made using an inorganic material such as SiOx (silicon oxide) by a vapor phase growth method, and substantially vertically oriented with respect to a liquid crystal molecule. Such an opposite substrate 20 includes at least the common electrode 31 and the second orientation film 32.

As illustrated in FIG. 3, the liquid crystal device 100 includes at least a plurality of scanning lines 3a (gate lines) and a plurality of data lines 6a (source lines) which are insulated and orthogonal to each other in the display region E, and a fixed potential line extends in parallel with the scanning line 3a. A direction where the scanning line 3a extends is an X direction, and a direction where the data line 6a extends is a Y direction. Moreover, the fixed potential line can be disposed so as to extend in parallel with the data line 6a.

The scanning line 3a, the data line 6a, and a fixed potential line 300' are provided, and, in a region divided by a kind of a signal line of these lines, the pixel electrode 27, the TFT 30, and the capacitive element 70 are provided. These components constitute pixel circuits of the pixels P.

The scanning line 3a is electrically connected to a gate of the TFT 30, and the data line 6a is electrically connected to a data line side source drain region of the TFT 30. The pixel electrode 27 is electrically connected to the source drain region of the pixel electrode side of the TFT 30.

The data line 6a is connected to the data line driving circuit 22 (refer to FIG. 1), and supplies image signals D1, D2, . . . Dn from the data line driving circuit 22 to the pixels P. The scanning line 3a is connected to the scanning line driving circuit 24 (refer to FIG. 1), and supplies scanning signals SC1, SC2, . . . SCm supplied from the scanning line driving circuit 24 to each pixel P.

The image signals D1 to Dn supplied from the data line driving circuit 22 to the data line 6a may be supplied sequentially in this order, and may be supplied with respect to each group of a plurality of the data lines 6a adjacent to each other. The scanning line driving circuit 24 supplies the scanning signals SC1 to SCm to the scanning line 3a in an order of lines at a predetermined timing in a pulse form.

The liquid crystal device 100 enters an ON-state for only a certain period by inputting the scanning signals SC1 to SCm using the TFT 30 which is the switching element, and has a configuration in which the image signals Dl to Dn supplied from the data line 6a are written in the pixel electrode 27 at a predetermined timing. In addition, the image signals D1 to Dn of a predetermined level, which are written in the liquid crystal layer 15 through the pixel electrode 27, are maintained at a certain period between the pixel electrode 27 and the common electrode 31 disposed to be oriented through the liquid crystal layer 15.

In order to prevent the maintained image signals D1 to Dn from leaking, the capacitive element 70 parallel with a liquid crystal capacitor formed between the pixel electrode 27 and the common electrode 31 is connected thereto. The capacitive element 70 is provided between the source drain region of the pixel electrode side of the TFT 30 and the fixed potential line 300'.

Figure 4:
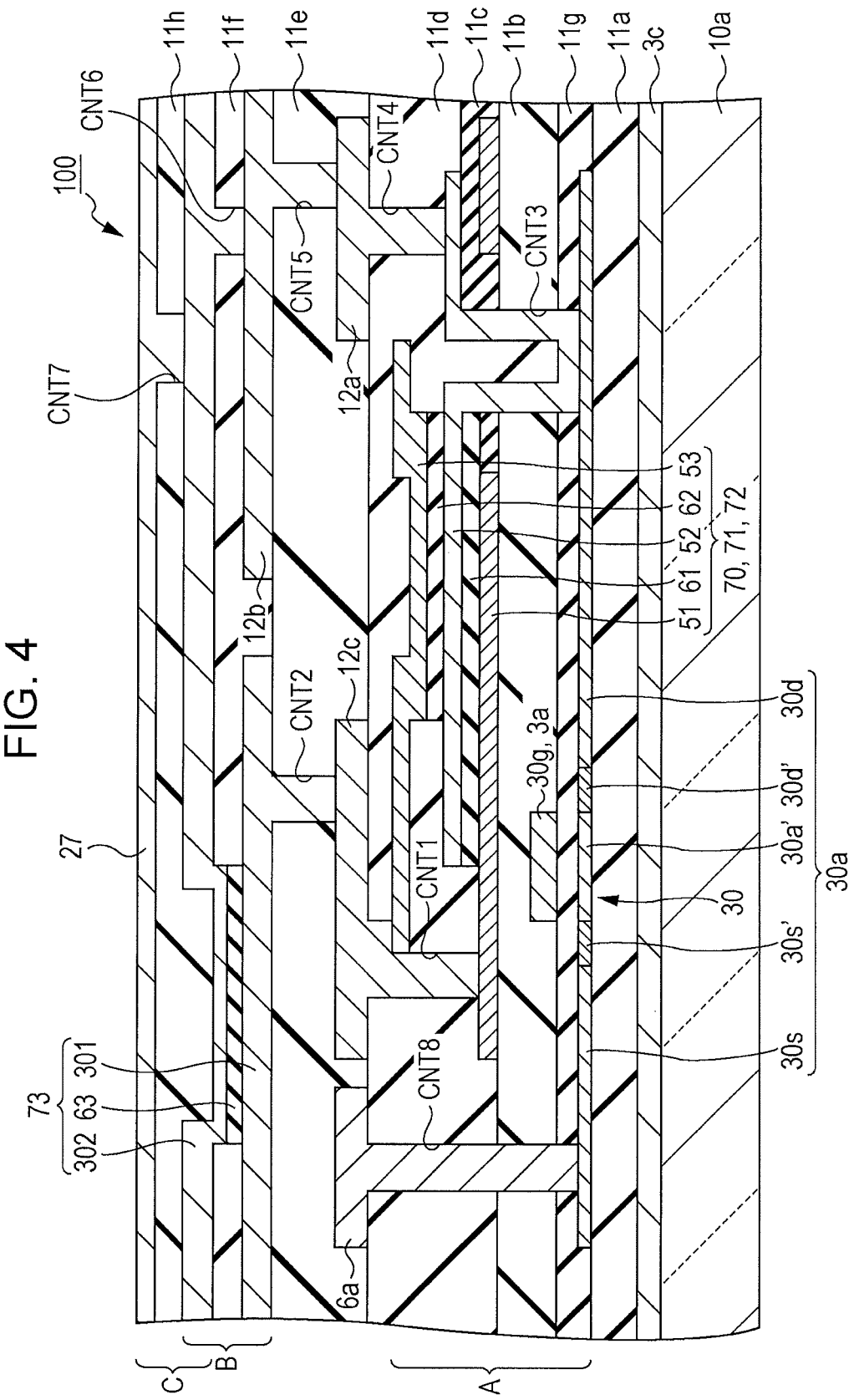
FIG. 4 is a perspective sectional view illustrating a structure of pixels constituting the liquid crystal device.
Figure 5:
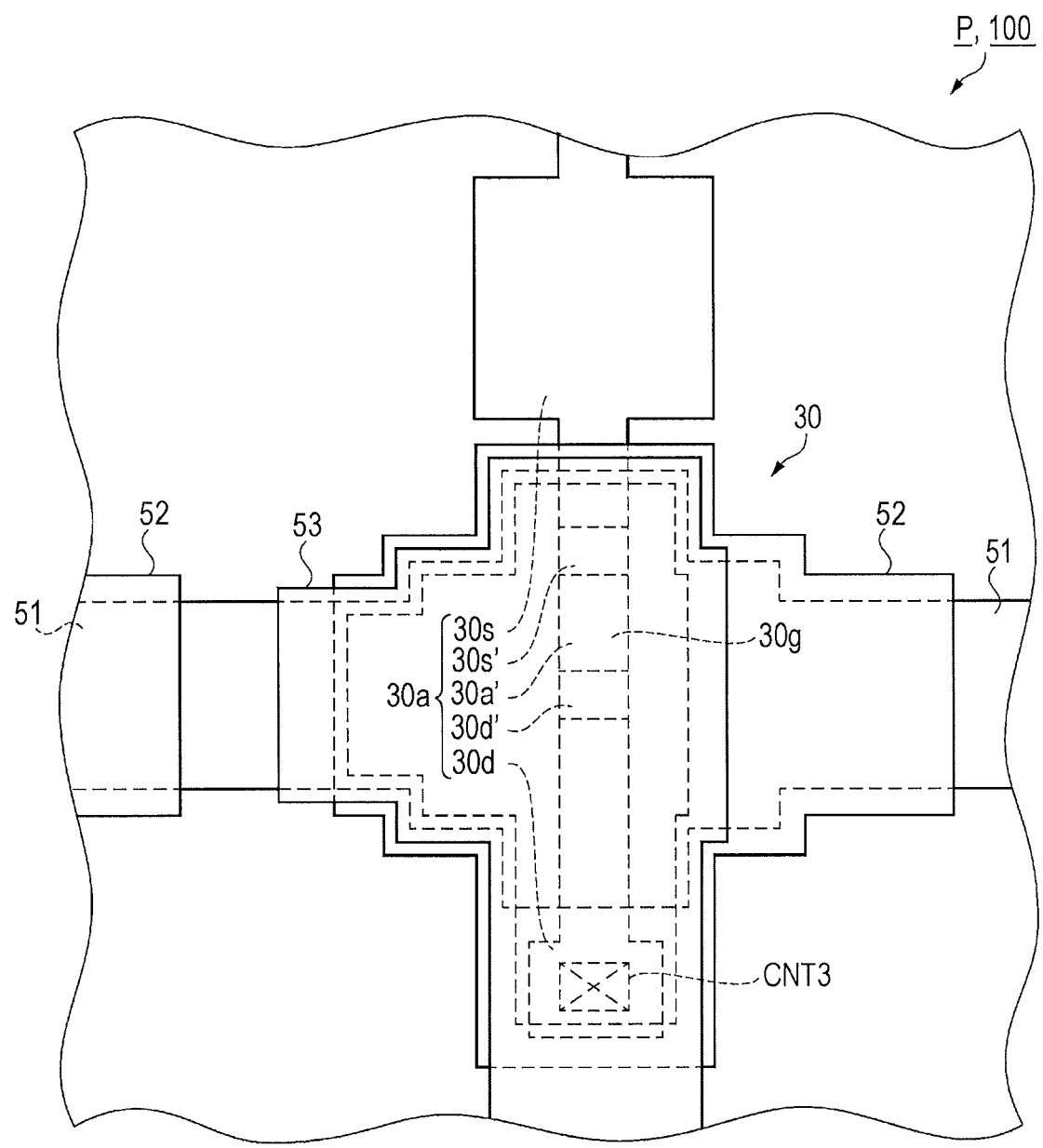
FIG. 5 is a perspective plan view of which a layer of an A part among pixels illustrated in FIG. 4 is seen from the top.
Figure 6:
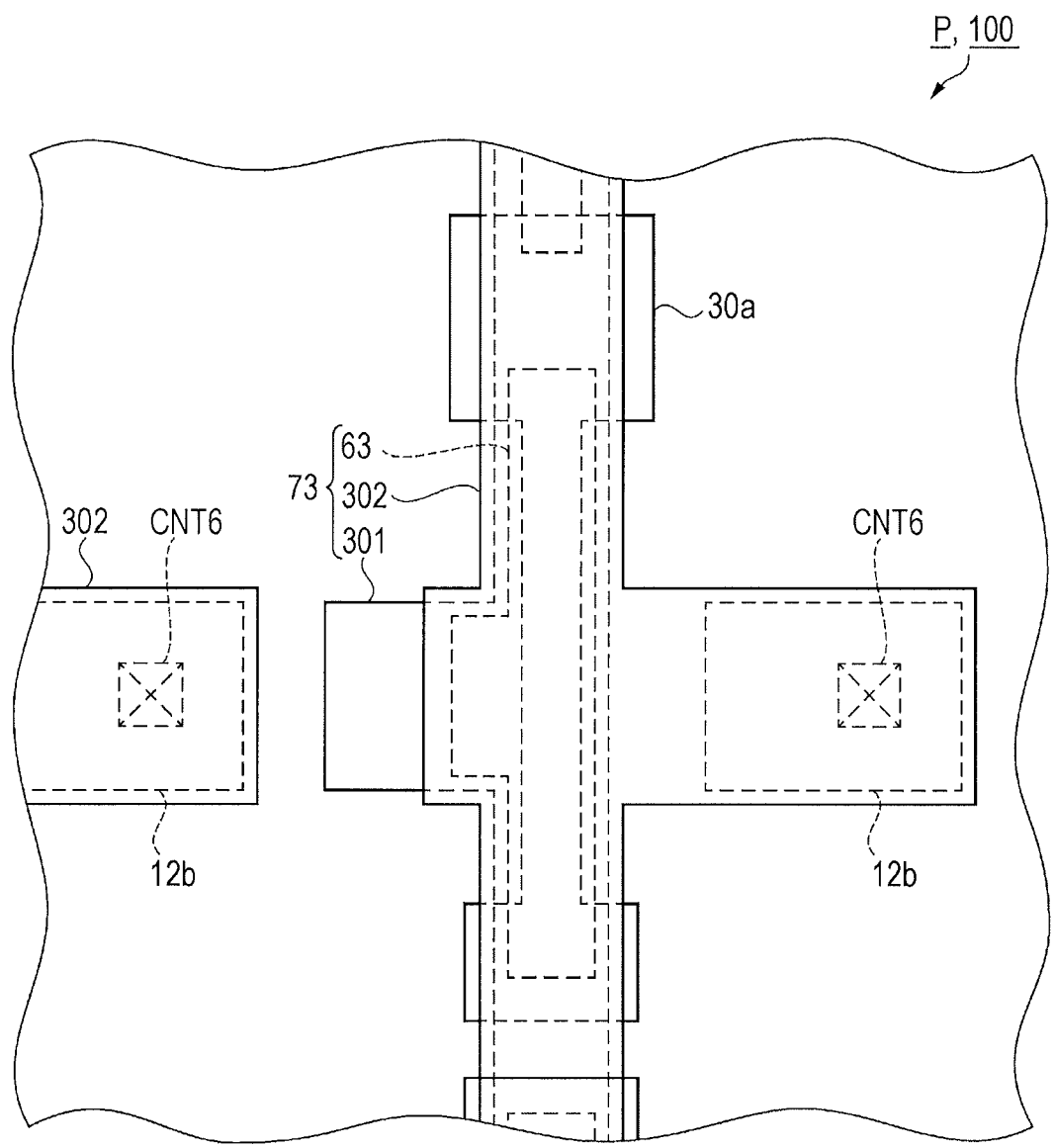
FIG. 6 is a perspective plan view of which a layer of a B part among the pixels illustrated in FIG. 4 is seen from the top.
Figure 7:
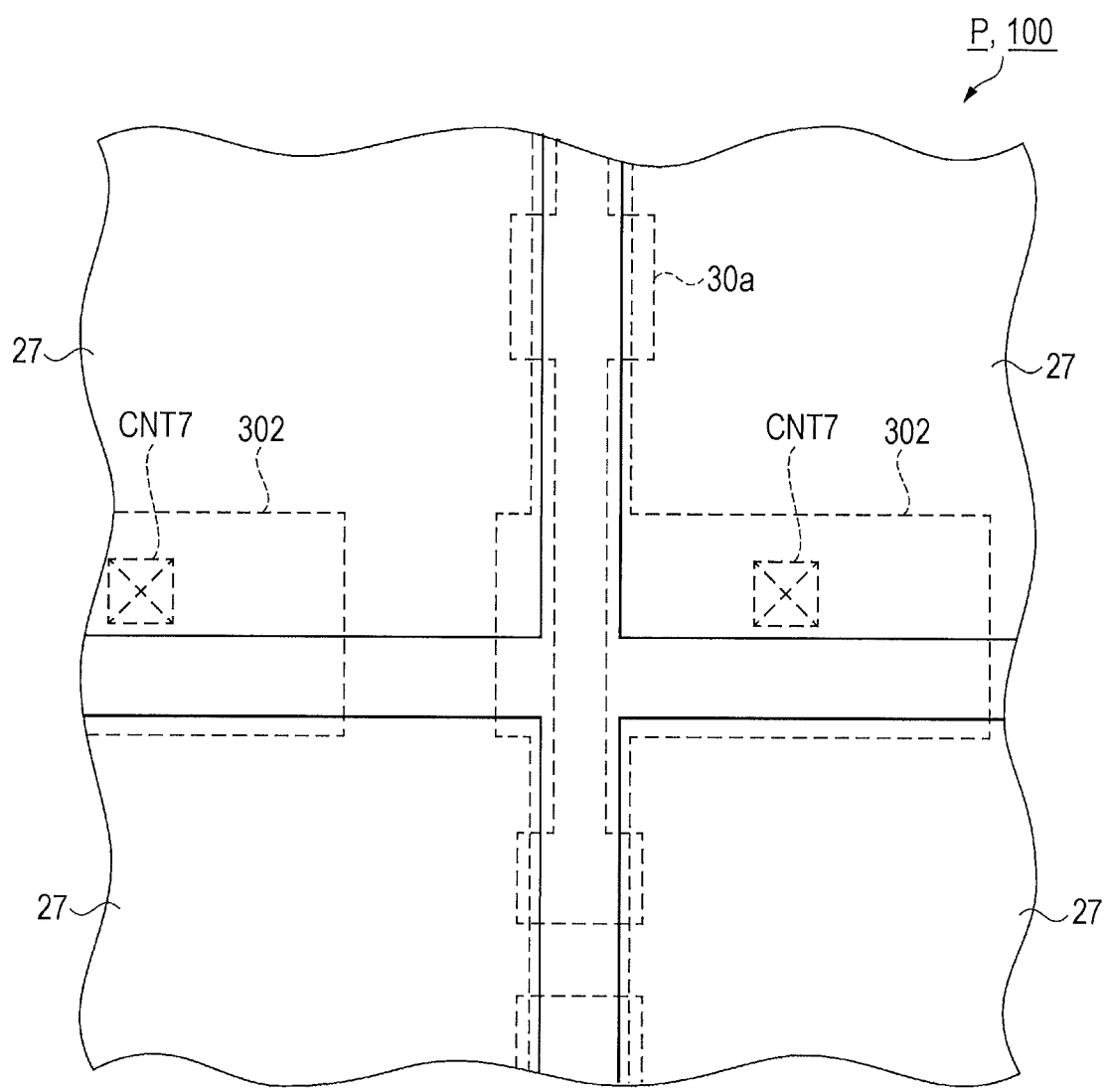
FIG. 7 is a perspective plan view of which a layer of a C part among the pixels illustrated in FIG. 4 is seen from the top.

FIG. 4 is a perspective sectional view illustrating a structure of the pixels constituting the liquid crystal device. FIG. 5 is a perspective plan view of which a layer of an A part among the pixels illustrated in FIG. 4 is seen from the top. FIG. 6 is a perspective plan view of which a layer of a B part among the pixels illustrated in FIG. 4 is seen from the top. FIG. 7 is a perspective plan view of which a layer of a C part among the pixels illustrated in FIG. 4 is seen from the top. Hereinafter, a configuration of the pixels will be described with reference to FIG. 4 to FIG. 7.

As illustrated in FIG. 4 and FIG. 5, the TFT 30 has a LDD structure, and includes a semiconductor layer 30a and a gate electrode 30g. The semiconductor layer 30a is constituted by, for example, polysilicon. Specifically, the semiconductor layer 30a includes a channel region 30a', a data line side LDD region 30s', a pixel electrode side LDD region 30d', a data line side source drain region 30s, and a pixel electrode side source drain region 30d.

The data line side source drain region 30s and the pixel electrode side source drain region 30d are formed to be symmetrical on the basis of the channel region 30a'. The data line side LDD region 30s' is formed between the channel region 30a' and the data line side source drain region 30s. The pixel electrode side LDD region 30d' is formed between the channel region 30a' and the pixel electrode side source drain region 30d.

The data line side LDD region 30s', the pixel electrode side LDD region 30d', the data line side source drain region 30s, and the pixel electrode side source drain region 30d are, for example, an impurity region where an impurity is implanted in the semiconductor layer 30a by implanting an impurity using an ion implantation method, or the like.

The data line side LDD region 30s' and the pixel electrode side LDD region 30d' are respectively formed as a low concentration impurity region where the impurity is smaller than that of the data line side source drain region 30s and that of the pixel electrode side source drain region 30d. According to such an impurity region, at the time of a non-operation of the TFT 30, an off-current flowing between a source region and a drain region is reduced, and a decrease of an on-current flowing at the time of operating the TFT 30 can be suppressed.

The gate electrode 30g is formed of, for example, a conductive polysilicon, and a part thereof is formed to face the channel region 30a' of the semiconductor layer 30a. The gate electrode 30g and the semiconductor layer 30a are insulated from each other by a gate insulating film 11g.

In a lower layer side through a base insulating film 11a disposed lower than the TFT 30, a scanning line 3c is provided. The scanning line 3c is made of, for example, a light shielding material such as an elemental metal, an alloy, metal silicide, poly silicide, and a multilayer in which these are stacked, including at least one of high melting point metals such as Ti (titanium), Cr (chromium), W (tungsten), Ta (tantalum), Mo (molybdenum), and Pd (palladium).

The scanning line 3c functions as a lower side light-shielding film that shields a return light beam from the channel region 30a' of the TFT 30 and vicinity thereof, which is incident from the element substrate 10 side into the device, and is light reflecting from a rear surface in the element substrate 10 or light penetrating into a synthesis optical system emitted from the other liquid crystal device to a double plate type projector, or the like.

In an upper layer side through an interlayer insulating film 11b disposed higher than the TFT 30, a first capacitive element 71 and a second capacitive element 72 constituting the capacitive element 70 are provided. The first capacitive element 71 is configured to have a first capacitance electrode 51 (first electrode), a first capacitance insulating film 61 (first capacitance film), and a second capacitance electrode 52 (second electrode) from the lower layer side. The second capacitive element 72 is configured to have the second capacitance electrode 52, a second capacitance insulating film 62 (second capacitance film), and a third capacitance electrode 53 (third electrode) from the lower layer side.

The first capacitance electrode 51 and the third capacitance electrode 53 are a fixed potential side capacitance electrode which is electrically connected to a constant potential source through a fixed potential line (LCCOM) 301 and a relay electrode 12c. Specifically, the first capacitance electrode 51 is electrically connected to the relay electrode 12c through a contact hole CNT1. In the same way, the third capacitance electrode 53 is also electrically connected to the relay electrode 12c through the contact hole CNT1.

The first capacitance electrode 51 and the third capacitance electrode 53 are formed of, for example, a non-transparent metal film including metal such as Al (aluminum), Ag (silver), or an alloy thereof, and also functions as an upper light shielding film (built-in light shielding film) which light-shields the TFT 30.

Moreover, the first capacitance electrode 51 and the third capacitance electrode 53 include at least one of high melting point metals such as Ti, Cr, W, Ta, Mo, and Pd, and are made of an elemental metal, an alloy, metal silicide, poly silicide, a multilayer in which these are stacked, and the like. In this case, a function as a built-in light shielding film of the first capacitance electrode 51 and the third capacitance electrode 53 can be increased.

The second capacitance electrode 52 is a pixel potential side capacitance electrode which is electrically connected to the source drain region 30d of the pixel electrode side of the TFT 30 and a pixel electrode 27. Specifically, the second capacitance electrode 52 is electrically connected to the pixel electrode side source drain region 30d through a contact hole CNT3, and is electrically connected to the pixel electrode 27 through contact holes CNT4 to CNT7 and relay electrodes 12a and 12b, and a fourth capacitance electrode 302 (fourth electrode).

The first capacitance insulating film 61 and the second capacitance insulating film 62 are dielectric films, and for example, hafnia ($HfO_2$), alumina ($Al_2O_3$), and silicon nitride (SiN), are exemplified.

Returning to FIG. 4, in an upper layer side through the interlayer insulating film 11d disposed higher than the third capacitance electrode 53 on the element substrate 10, the data line 6a, and the relay electrodes 12a and 12c are provided.

In the data line side source drain region 30s of the semiconductor layer 30a, the data line 6a is electrically connected through a contact hole CNT8 penetrating the gate insulating film 11g, and the interlayer insulating films 11b, 11c, and 11d. An inside of the data line 6a and the contact hole CNT8 is made of, for example, an Al (aluminum) containing material such as Al—Si—Cu and Al—Cu, or an Al simple substance, or a multilayer film of an Al layer and a TiN layer. The data line 6a also has a function of light-shielding the TFT 30.

The relay electrodes 12a and 12c are formed on the same layer as the layer where the data line 6a on the interlayer insulating film 11d. The data line 6a, and the relay electrodes 12a and 12c are formed, for example, when a thin film made of a conductive material of a metal film, or the like, is formed on the interlayer insulating film 11d using a thin film forming method, and the formed thin film is partially removed, that is, is patterned so as to be separated from each other. As seen from the above, when the data line 6a, and the relay electrodes 12a and 12c are formed in the same process, a manufacturing process of the apparatus can be simple.

As illustrated in FIG. 4 and FIG. 6, in the upper layer side through the interlayer insulating film 11e disposed higher than the data line 6a of the element substrate 10, the fixed potential line 301 and the relay electrode 12b are provided.

The fixed potential line 301 is constituted to have a metal, for example, aluminum, and supplies a fixed potential, like that of the first capacitance electrode 51 and the third capacitance electrode 53. Meanwhile, the relay electrode 12b, formed on the same layer where the fixed potential line 301 is formed, relays electric conduction between the pixel electrode side source drain region 30d in the semiconductor layer 30a and the pixel electrode 27.

In addition, in the pixel electrode 27 side of the interlayer insulating film 11e, the fourth capacitance electrode 302 is disposed on the pixel electrode 27 side of the fixed potential line 301 through a third capacitance insulating film 63 (third capacitance film), and thus a third capacitive element 73 constituting the capacitive element 70 is formed.

The fourth capacitance electrode 302 is electrically connected to the relay electrode 12b through the contact hole CNT6. That is, the fourth capacitance electrode 302 is electrically connected to the pixel electrode side source drain region 30d and the pixel electrode 27.

As the third capacitance insulating film 63, for example, a material that is the same as that of the first capacitance insulating film 61 and the second capacitance insulating film 62 is used.

As illustrated in FIG. 4 and FIG. 7, in an upper layer of the third capacitive element 73, the pixel electrode 27 is provided through the interlayer insulating film 11h. The pixel electrode 27 is electrically connected to the pixel electrode side source drain region 30d of the semiconductor layer 30a through the contact holes CNT3 to CNT7, the second capacitance electrode 52, the relay electrodes 12a and 12b, and the fourth capacitance electrode 302.

The contact hole CNT7 which electrically connects the pixel electrode 27 and the fourth capacitance electrode 302 is formed by forming a film using a conductive material constituting the pixel electrode 27, such as ITO, on an inner wall of a hole, which is formed to penetrate the interlayer insulating film 11h. In an upper side surface of the pixel electrode 27, an orientation film on which a predetermined orientation process such as a rubbing process is performed.

A configuration of the pixel part is common to each of the pixel parts, and these pixel parts are periodically formed in the display region E (refer to FIG. 1).

As seen from the above, the first capacitive element 71 and the second capacitive element 72, which are connected in parallel to each other on the TFT 30, are formed, and again, the third capacitive element 73 is formed on an upper layer of the data line 6a, and thus, the maintaining capacitor for maintaining the pixel potential can be increased. Accordingly, it becomes possible to deal with high resolution (high speed driving), and display quality can be improved.

In addition, the fixed potential line 301, the relay electrode 12c, the contact hole CNT1, and the first capacitance electrode 51, and the like, which are electrically connected to the fixed potential, are disposed between the first capacitive element 71, the second capacitive element 72, and the third capacitive element 73, and the data line 6a and the scanning line 3a. Accordingly, deterioration of display quality, such as flickering of the display image, can be suppressed.

Configuration of Electronic Apparatus

Figure 8:
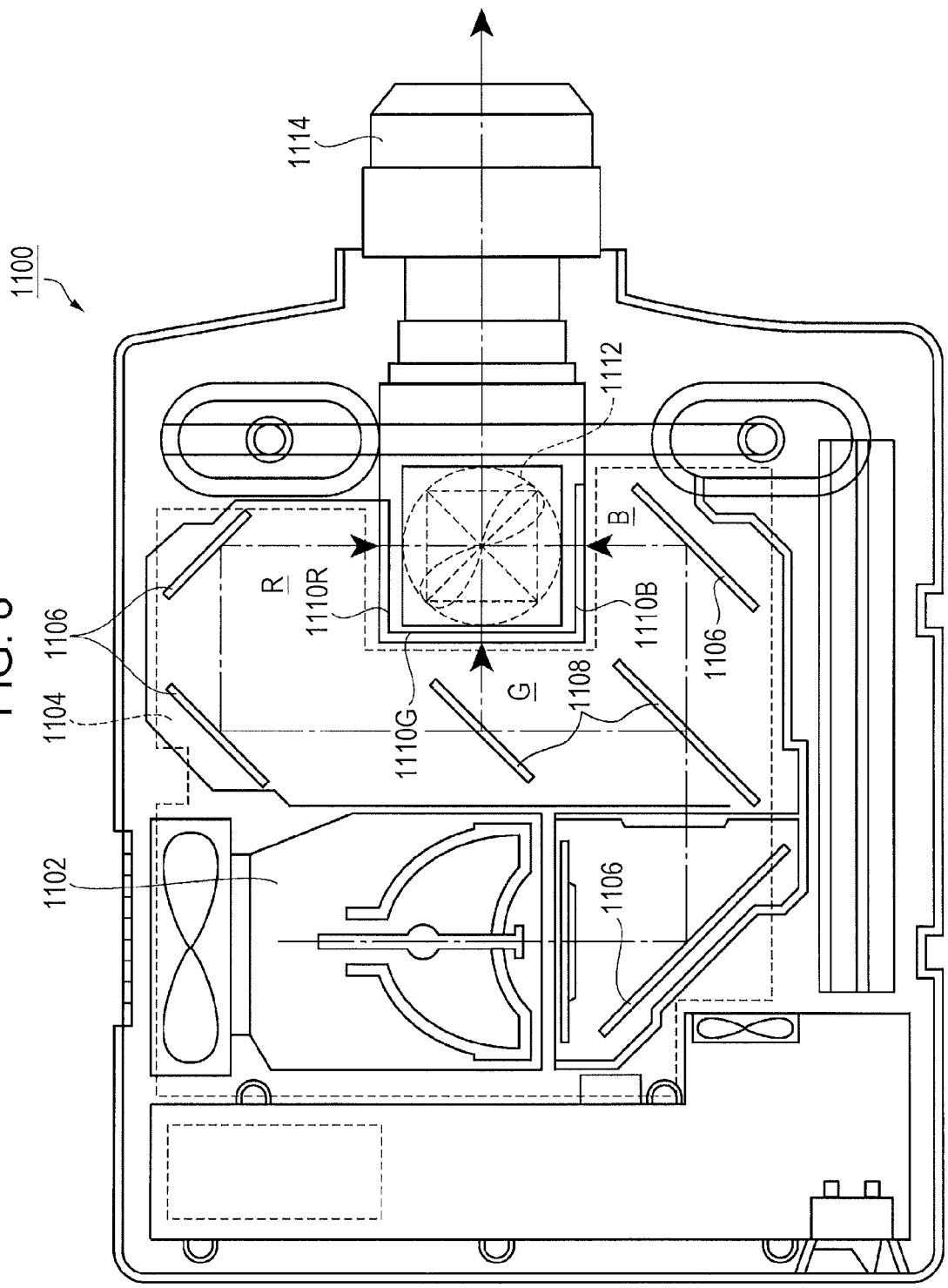
FIG. 8 is a perspective view illustrating a configuration of a projector as an electronic apparatus including the liquid crystal device.

FIG. 8 is a perspective view illustrating a configuration of a projector which is used as an electronic apparatus including the liquid crystal device described above. Hereinafter, the configuration of the projector will be described with reference to FIG. 8.

As illustrated in FIG. 8, in an inside of a projector 1100, a lamp unit 1102 emitting a white light source, such as a halogen lamp, is provided. Projection light emitted from the lamp unit 1102 is divided three primary colors of RGB by four mirrors 1106 and two dichroic mirrors 1108, which are disposed in a light guide 1104, and then the light beams are incident on liquid crystal devices 1110R, 1110B, and 1110G as light valves corresponding to each of the primary colors.

Configurations of the liquid crystal devices 1110R, 1110B, and 1110G, are the same as that of the liquid crystal device 100 described above, and are driven by each of primary signals of R, G, and B supplied from the image signal processing circuit. Also, light beams modulated by the liquid crystal devices 1110R, 1110B, and 1110G are incident on a dichroic prism 1112 from three directions. In the dichroic prism 1112, the light beams of R and B are refracted at 90 degrees, and the light beam of G is emitted straightly. Accordingly, images of each color are synthesized, as a result, color images are projected to a screen, or the like through a projection lens 1114.

Here, when focusing on displayed images by each of the liquid crystal devices 1110R, 1110B, and 1110G, it is necessary to horizontally invert the image displayed by the liquid crystal device 1110G, with respect to the displayed images by the liquid crystal devices 1110R and 1110B.

In addition, since the light beam corresponding to each of the primary colors of the R, G, and B is incident in the liquid crystal devices 1110R, 1110B, and 1110G by the dichroic mirror 1108, it is not necessary to provide a color filter.

In addition, as the electronic apparatus where the liquid crystal device 100 is mounted, in addition to the projector 1100, various electronic apparatuses, such as head-up displays (HUD), head-mounted displays (HMD), smartphones, electrical view finders (EVF), mobile mini projectors, electronic books, mobile phones, mobile computers, digital cameras, digital video cameras, displays, vehicle equipments, audio equipments, and exposure apparatuses or lighting devices, can be used.

As described above in detail, according to the liquid crystal device 100 and the projector 1100 of the embodiment, effects to be described below can be obtained.

(1) According to the liquid crystal device 100 of the embodiment, in addition to the first capacitive element 71 and the second capacitive element 72 provided in the TFT 30 side with respect to the data line 6a, the third capacitive element 73 provided in the pixel electrode 27 side with respect to the data line 6a is provided, and thus the maintaining capacitor for maintaining the pixel potential can be increased. Accordingly, deterioration of display quality due to insufficient maintaining capacitor can be suppressed. In addition, it becomes possible to deal with high speed driving in high resolution (for example, "4K2K", or the like), and high display quality can be obtained. Also, since the fixed potential line 301, the first capacitance electrode 51, and the third capacitance electrode 53 are disposed between the data line 6a (or scanning line 3a) and each of the capacitive elements 70 (71, 72, and 73), there is a possibility that the influence on a voltage for writing the pixel electrode is less likely to be received, when a voltage of the data line 6a is changed. Therefore, display quality can be improved.

(2) According to the liquid crystal device 100 of the embodiment, as described above, the influence of the voltage fluctuation of the data line can be suppressed, longitudinal crosstalk may be improved. Also, the longitudinal crosstalk is proportional to Csd/maintaining capacitance, and then the display quality of which having smaller value becomes better.

(3) According to the projector 1100 of the embodiment, since the liquid crystal device 100 disclosed above is provided thereto, the electronic apparatus capable of providing a high resolution display can be provided.

Second Embodiment

Configuration of Liquid Crystal Device

Figure 9:
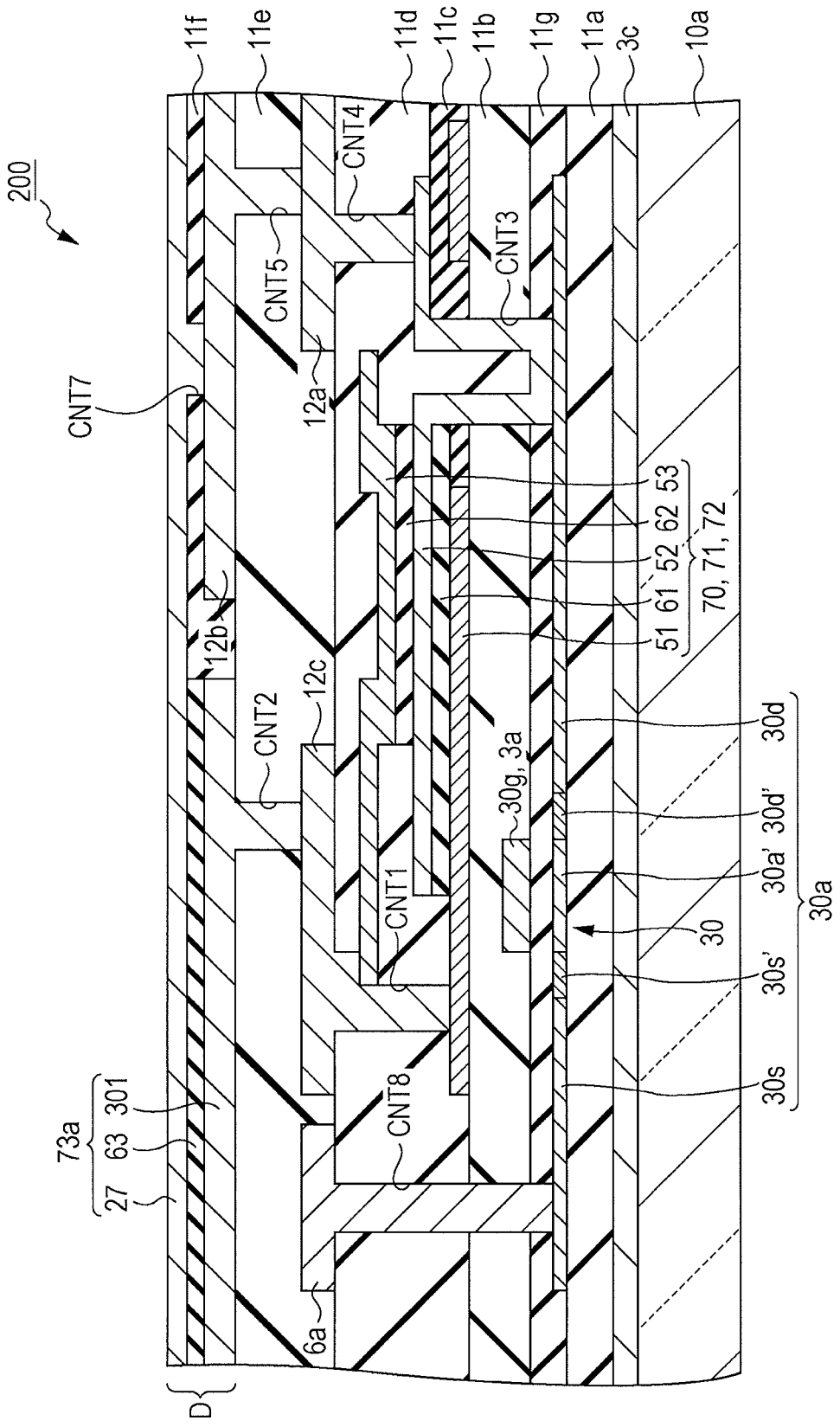
FIG. 9 is a perspective sectional view illustrating a configuration of pixels constituting a liquid crystal device of a second embodiment.
Figure 10:
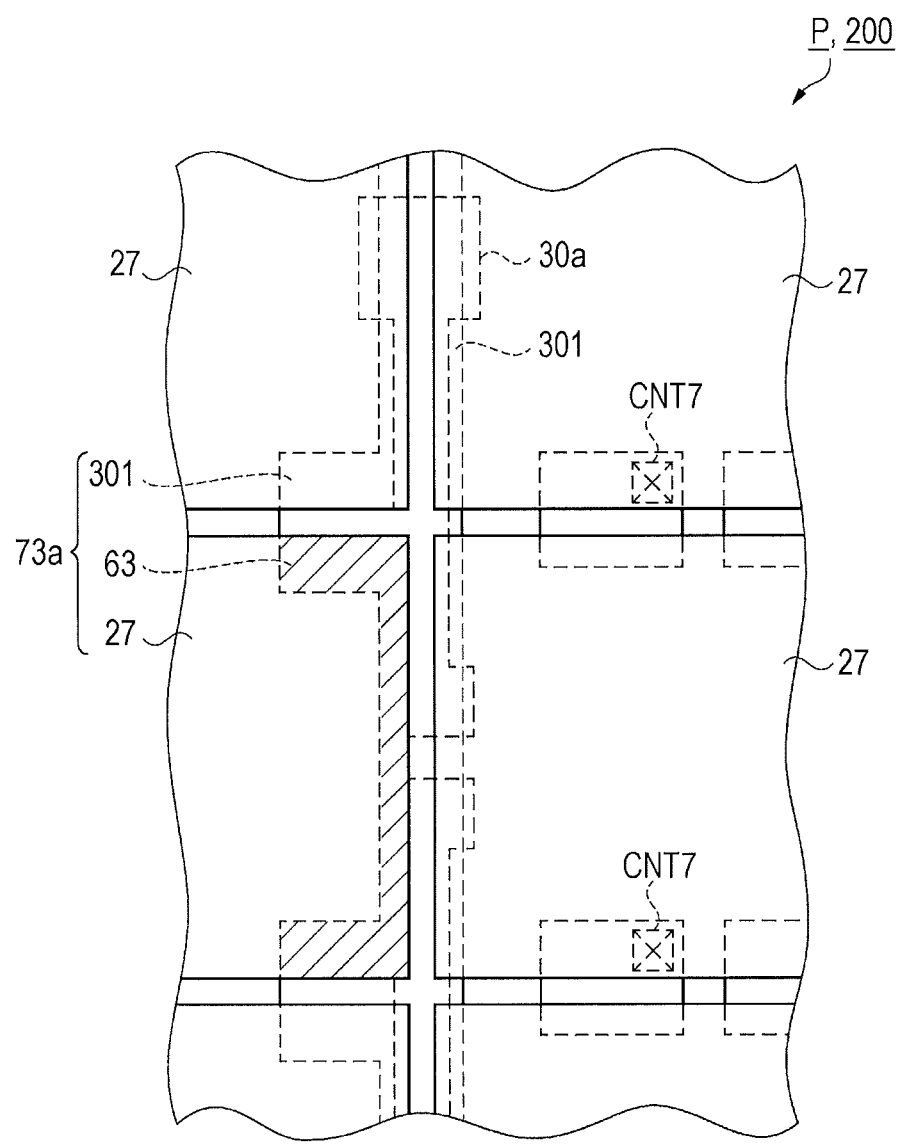
FIG. 10 is a perspective plan view of which a layer of a D part among pixels illustrated in FIG. 9 is seen from the top.

FIG. 9 is a perspective sectional view illustrating a configuration of pixels constituting a liquid crystal device of a second embodiment. FIG. 10 is a perspective plan view of which a layer of a D part among the pixels illustrated in FIG. 9 is seen from the top. Hereinafter, the configuration of the pixels of the second embodiment will be described with reference to FIG. 9 and FIG. 10.

The liquid crystal device 200 of the second embodiment has different configurations of the third capacitive element compared to the liquid crystal device 100 of the first embodiment described above, but has substantially the same configurations with respect to the other components. For this reason, in the second embodiment, the parts having different configurations from those of the first embodiment will be described in detail, and the other parts overlapped with each other will be appropriately omitted.

As illustrated in FIG. 9 and FIG. 10, in the liquid crystal device 200 of the second embodiment, the third capacitive element 73a is configured to have the fixed potential line 301, the third capacitance insulating film 63, and the pixel electrode 27.

As described above, the fixed potential line 301 is a fixed potential side capacitance electrode which is electrically connected to a constant potential source. The fixed potential line 301 is formed of an opaque metal film containing a metal, for example, Al (aluminum) or Ag (silver), or an alloy thereof.

As the third capacitance insulating film 63, for example, the same material as that of the first capacitance insulating film 61 and the second capacitance insulating film 62, which are described above, can be used. The pixel electrode 27 is made of, as described above, a transparent material, such as ITO.

According to the configuration, in the same manner of the first embodiment, three capacitive elements 70 (71, 72, and 73a) can be provided, and thus the maintaining capacitor for maintaining the pixel potential can be increased. Accordingly, it becomes possible to deal with the high resolution (high speed driving), display quality can be improved.

In addition, the fixed potential line 301, which is electrically connected to the fixed potential, is disposed between the third capacitive element 73a and the data line 6a, and thus deterioration of display quality, such as flickering of the display image, can be suppressed.

As described above in detail, according to the liquid crystal device 200 of the second embodiment, in addition to the effects of the first embodiment, effects to be described below can be obtained.

(4) According to the liquid crystal device 200 of the second embodiment, since the third capacitive element 73 is made of the transparent conductive material (ITO), for example, a metal material different from the pixel electrode 27 may not be patterned, and it is possible to efficiently form the third capacitive element 73 using a smaller number of manufacturing processes.

Third Embodiment

Configuration of Liquid Crystal Device

Figure 11:
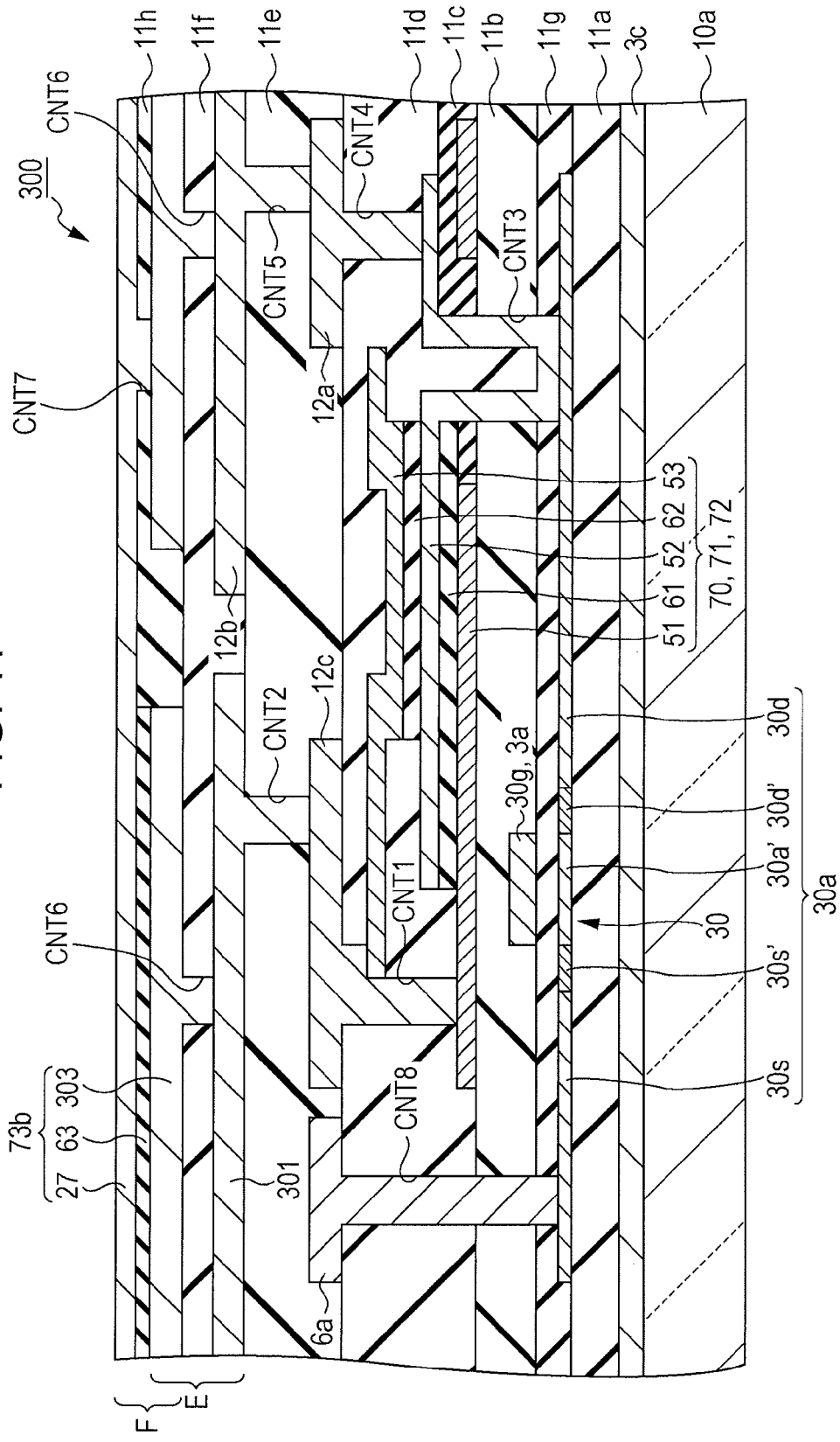
FIG. 11 is a perspective sectional view illustrating a configuration of pixels constituting a liquid crystal device of a third embodiment.
Figure 12:
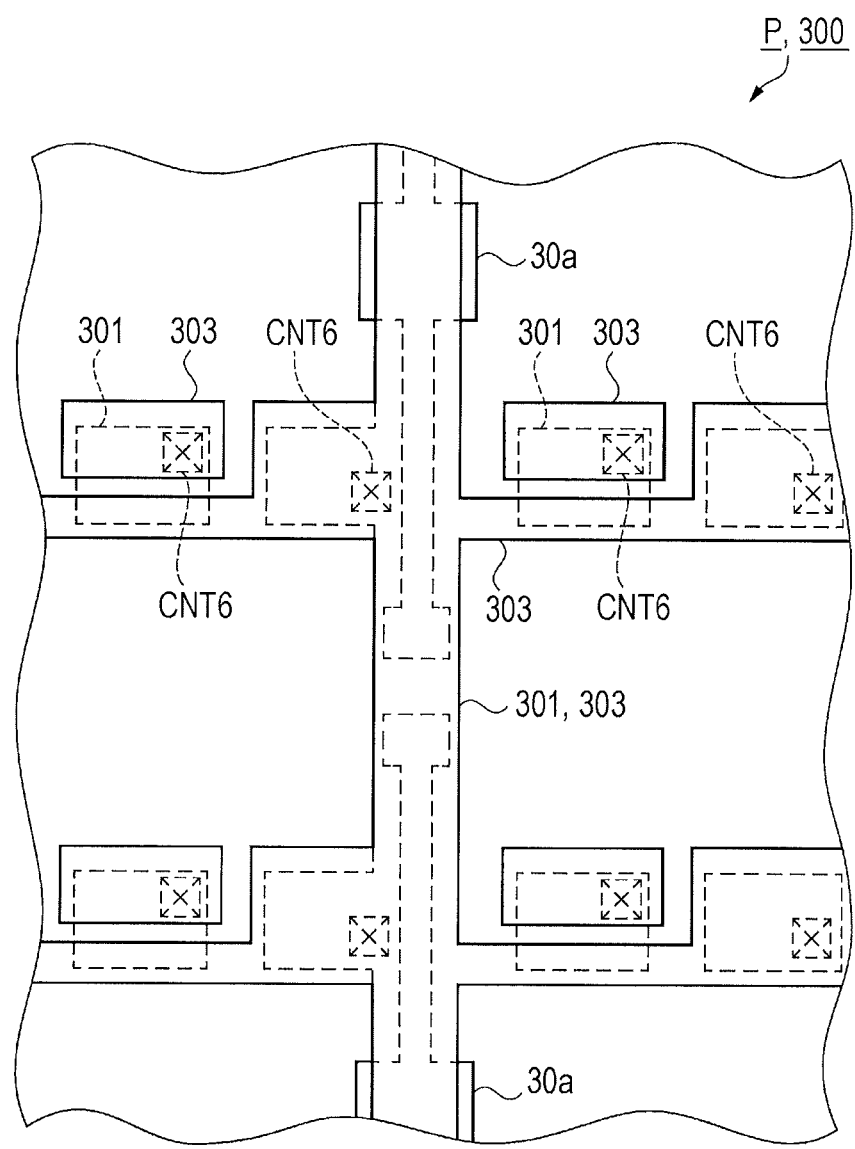
FIG. 12 is a perspective plan view of which a layer of an E part among pixels illustrated in FIG. 11 is seen from the top.
Figure 13:
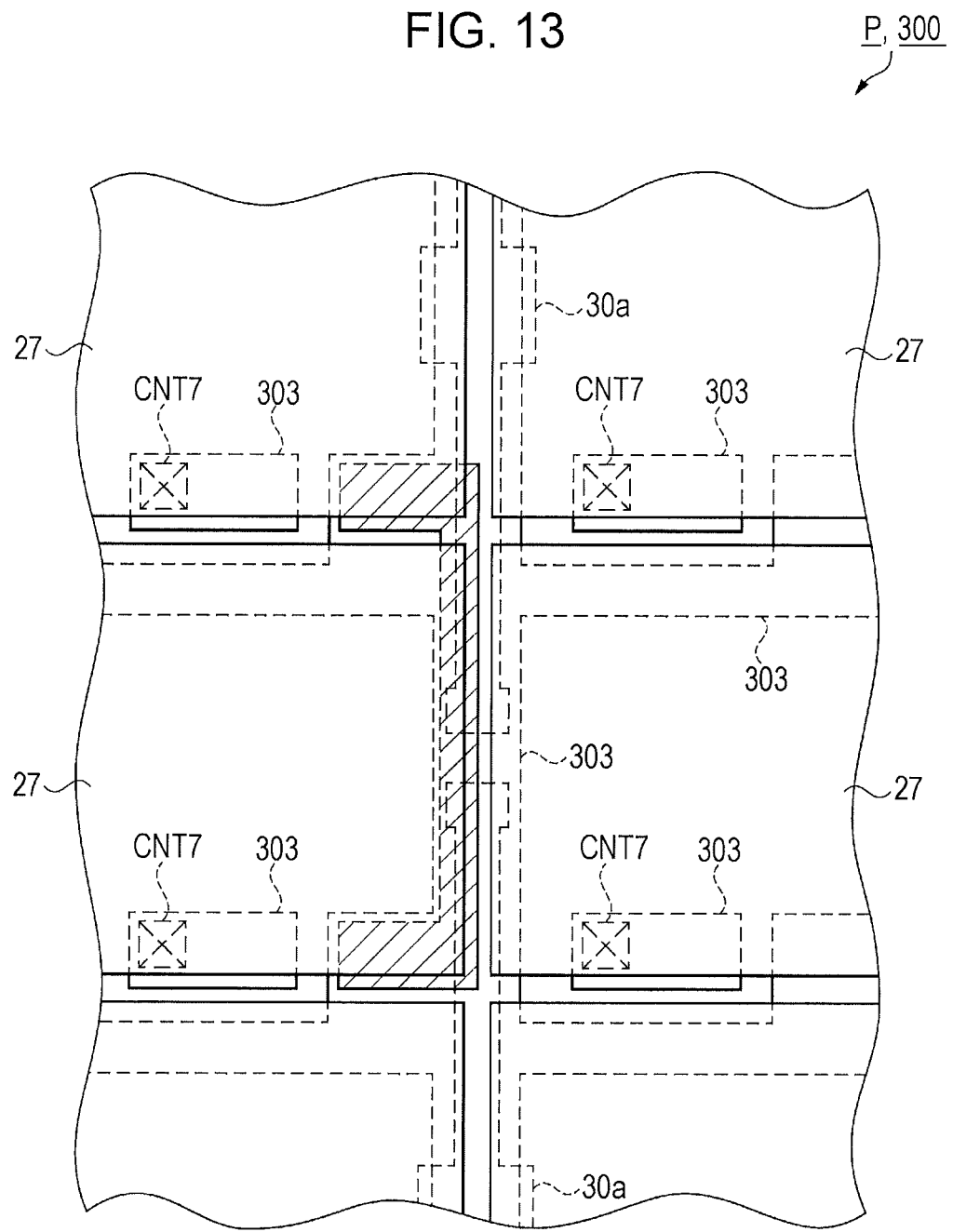
FIG. 13 is a perspective plan view of which a layer of an F part among the pixels illustrated in FIG. 11 is seen from the top.

FIG. 11 is a perspective sectional view illustrating a configuration of pixels constituting the liquid crystal device of the third embodiment. FIG. 12 is a perspective plan view of which a layer of an E part among the pixels illustrated in FIG. 11 is seen from the top. FIG. 13 is a perspective plan view of which a layer of an F part among the pixels illustrated in FIG. 11 is seen from the top. Hereinafter, the configuration of the pixels of the third embodiment will be described with reference to FIG. 11 to FIG. 13.

The liquid crystal device of the third embodiment 300 has a different configuration of the third capacitive element 73b, but has substantially the same configurations as the other parts, compared to the liquid crystal device 200 of the second embodiment described above. Therefore, in the third embodiment, parts having different configurations from those of the second embodiment will be described in detail, and the other parts overlapped with each other will be appropriately omitted.

As illustrated in FIG. 11 to FIG. 13, in the liquid crystal device of the third embodiment 300, the third capacitive element 73b is configured to have a second fixed potential line 303, the third capacitance insulating film 63, and the pixel electrode 27, which are different from a first fixed potential line 301.

The first fixed potential line 301 is electrically connected to the constant potential source. The second fixed potential line 303 is electrically connected to the first fixed potential line 301 through the contact hole CNT6. Also, the first fixed potential line 301 is formed in the same direction as an extending direction of the data line 6a. The second fixed potential line 303 is formed in the same direction as an extending direction of the scanning line 3a. That is, the first fixed potential line 301 and the second fixed potential line 303 are formed to intersect each other through an interlayer insulating film 11f.

The first fixed potential line 301 and the second fixed potential line 303 are made of, for example, an opaque metal film containing a metal, such as Al (aluminum) and Ag (silver), or an alloy thereof, in the same manner as that of the first capacitance electrode 51 and the third capacitance electrode 53.

As the third capacitance insulating film 63, for example, the same material as that of the first capacitance insulating film 61 and the second capacitance insulating film 62 can be used. As described above, the pixel electrode 27 is a transparent material, such as ITO.

According to the configuration, in the same manner of the first embodiment and the second embodiment, the three capacitive elements 70 (71, 72, and 73b) can be provided, and thus the maintaining capacitor for maintaining the pixel potential can be increased. Accordingly, it becomes possible to deal with high resolution (high speed driving), and display quality can be improved.

In addition, since the first fixed potential line 301 electrically connected to the fixed potential is disposed between the third capacitive element 73 and the data line 6a, deterioration of display quality, such as flickering of the display image, can be suppressed.

In addition, the first fixed potential line 301 electrically connected to the constant potential source is formed in the same direction as an extending direction of the data line 6a, and also, the second fixed potential line 303 is formed in the same direction as an extending direction of the scanning line 3a. In other words, two layers of the fixed potential line are formed to intersect each other in a non-display region of the pixels P, and thus the fixed potential line can be increased and a resistance can be reduced without greatly reducing an aperture ratio. As a result, high resolution display quality can be obtained.

As described above in detail, according to the liquid crystal device of the third embodiment 300, in addition to the effects of the first embodiment and the second embodiment, effects to be described below can be obtained.

(5) According to the liquid crystal device of the third embodiment 300, the first fixed potential line 301 electrically connected to the constant potential source and the second fixed potential line 303 are disposed to intersect each other through the interlayer insulating film 11. In other words, the fixed potential lines 301 and 303, which are formed in a matrix shape when seen from the top, are increased, and thus resistance of the fixed potential lines 301 and 303 can be reduced. Also, since the lines are formed on each of different layers, low-resistance can be realized, even when a wiring width is not widened. In addition, an opening area is not greatly deteriorated. Moreover, according to the fixed potential lines 301 and 303, a shielding region with respect to the data line 6a (or scanning line 3a) can be increased, and thus a voltage for writing in the pixel electrode does not easily receive the influence of a voltage fluctuation of the source line. Therefore, display quality can be improved.

Also, an aspect of the invention is not limited to the embodiments described above, and can be appropriately modified in a range not departing from the gist or the concept of the invention described according to claims and the entire of a specification, and the modified resultant is included in a technological range of the aspect of the invention. In addition, it can be performed in a shape to be described below.

Modification Example 1

As described above, the invention is not limited to the use of the liquid crystal device 100 as the electro-optical device, and for example, may be appropriately applied to an organic EL apparatus, such as a plasma display, an electronic paper (EPD), and the like. Furthermore, in addition to the liquid crystal device 100 of a transmission type, the invention may be applied to, for example, a reflective type liquid crystal device.

This application claims priority to Japan Patent Application No. 2015-106170 filed May 26, 2015, the entire disclosures of which are hereby incorporated by reference in their entireties.

What is claimed is:

1. An electro-optical device comprising:
   a substrate;
   a transistor over the substrate;
   a pixel electrode over the transistor;
   a source line between the transistor and the pixel electrode;
   a fixed potential line over the substrate, the fixed potential line is supplied a fixed potential;
   a first capacitive element comprising a first electrode electrically connected to the fixed potential line, a first capacitance film, and a second electrode;
   a second capacitive element comprising the second electrode, a second capacitance film, and a third electrode electrically connected to the fixed potential line; and
   a third capacitive element comprising the fixed potential line, a third capacitance film, and a fourth electrode,
   wherein the first capacitive element and the second capacitive element are positioned between the transistor and the source line, and
   wherein the third capacitive element is positioned between the source line and the pixel electrode.

2. An electronic apparatus comprising:
   the electro-optical device according to claim 1.

* * * * *